United States Patent [19]

Kameyama

[11] Patent Number: 6,121,060
[45] Date of Patent: Sep. 19, 2000

[54] METHOD OF MEASURING A CONCENTRATION PROFILE

[75] Inventor: Akiko Kameyama, Tokyo, Japan

[73] Assignee: NEC Corporation, Tokyo, Japan

[21] Appl. No.: 09/084,206

[22] Filed: May 26, 1998

[30] Foreign Application Priority Data

May 26, 1997 [JP] Japan ..................................... 9-135128

[51] Int. Cl.$^7$ ............................ G01R 31/26; H01L 21/66
[52] U.S. Cl. .............................................................. 438/14
[58] Field of Search ................................ 438/5, 7, 8, 10, 438/14, 16, 17

[56] References Cited

U.S. PATENT DOCUMENTS 5,681,987 10/1997 Gamble ..................................... 73/105

FOREIGN PATENT DOCUMENTS

| | | |
|---|---|---|
| 2-112253 | 4/1990 | Japan . |
| 4-111337 | 4/1992 | Japan . |
| 4-11137 | 4/1992 | Japan . |
| 8-285519 | 11/1996 | Japan . |

OTHER PUBLICATIONS

D. Venables et al., "Quantitative Two–Dimensional Dopant Profiles Obtained Directly from Secondary Electron Images", Workshop on the Measurements and Characterization of Ultra–Shallow Doping Profiles in Semiconductors, 1995, pp. 43–1—43–7.

C. Spinella et al., "Two–Dimensional Junction Profiling By Selective Chemical Etching: Applications to Electron Device Characterization", Workshpo on the Measurements and Characterization of Ultra–Shallow Doping Profiles in Semiconductors, pp. 42–1—42/8.

V. Raineri et al., "Carrier Distribution in Silicon Devices by Atomic Force Microscopy on Etched Surfaces", Appl. Phys. Letter, vol. 64, No. 3, Jan. 1994, pp. 354–356.

M. Barrett et al., "2–D Dopant Profiling in VLSI Devices Using Dopant–Selective Etching: And Atomic Force Microscopy Study", IEEE Electron Device Letters, vol. 16, No. 3, Mar. 1995, pp. 118–120.

W. Vandervorst et al., "On The Determination of Two–Dimensional Carrier Distributions", Nuclear Instruments and Methods in Physics Research B96, (1995), pp. 123–132.

*Primary Examiner*—Brian Dutton
*Attorney, Agent, or Firm*—Sughrue, Mion, Zinn, Macpeak & Seas, PLLC

[57] ABSTRACT

A method of measuring the two-dimensional dopant concentration profile in a source/drain region included in a semiconductor device is disclosed. A semiconductor substrate is etched by an etchant of the kind etching a semiconductor by an amount dependent on a dopant concentration. The etched configuration of the substrate is filled with a filler, and then the filler is separated from the substrate and has its configuration measured. Dopant concentrations and therefore a dopant profile is produced from the configuration of the filler, or a replica of the substrate, measured on the basis of data representative of a relation between the dopant configuration and the amount of etching prepared beforehand. The method insures reliable measurement even in a high dopant concentration region.

8 Claims, 7 Drawing Sheets

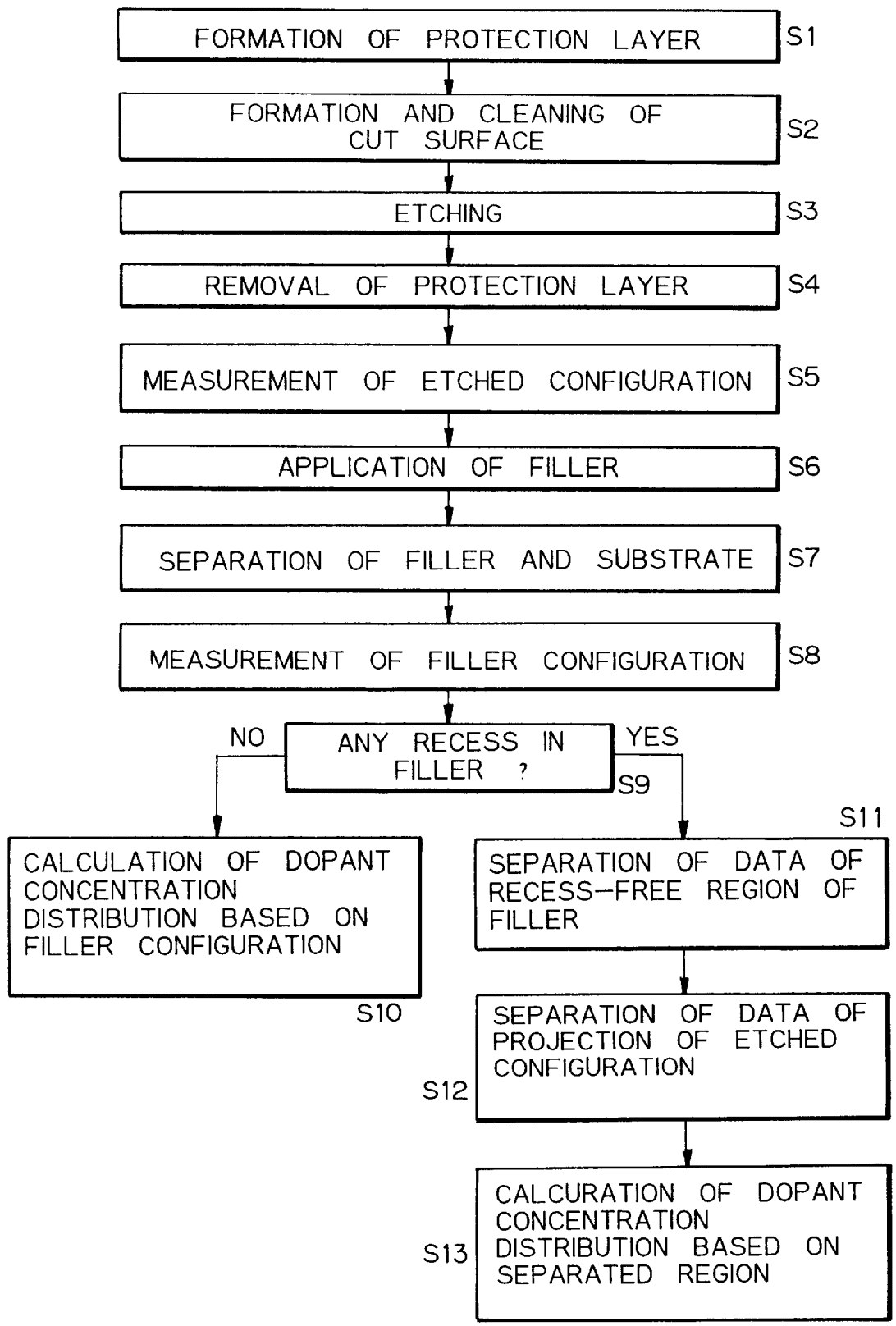

METHOD OF MEASURING A CONCENTRATION PROFILE

BACKGROUND OF THE INVENTION

The present invention relates to a method of measuring the dopant concentration profile of a semiconductor and, more particularly, to a method of measuring the two-dimensional concentration profile of a dopant existing in a source/drain region.

Microconfigurations of semiconductor devices have given rise to various problems to be solved. Among them, a threshold voltage increasing with a decrease in gate length, i.e., a short channel effect is critical. While studies using simulation or similar implementation are under way in search of a solution to the short channel effect problem, the measurement of the two-dimensional concentration profile of a dopant in a source/drain region is essential for more reliable design of semiconductor devices.

It has been customary to measure the one-dimensional concentration profile of a dopant by secondary ion mass spectroscopy (SIMS) or spreading resistance (SR) measurement. Although this kind of method is applicable to the measurement of depth profiles, it cannot perform two-dimensional measurement. While a two-dimensional display mode, called mapping, has recently been added to SIMS, the probe diameter of primary ions used by SIMS is usually of the order of microns and cannot implement a resolution sufficient for the evaluation of a source/drain region. A decrease in the probe diameter of SIMS, if realized, would lower sensitivity due to the principle of measurement particular to SIMS. In practice, therefore, the two-dimensional dopant concentration profiles is not achievable with SIMS.

To measure a two-dimensional dopant concentration profile, there have been proposed methods using microscopy. For example, a measuring method using a scanning electron microscope (SEM) is disclosed by Venables et al in Proc. 3rd Intern. Workshop on the Measurements and Characterization of Ultra-Shallow Doping Profiles in Semiconductors, pp. 43-1–43.7, 1995. The SEM scheme, however, has a problem that the charge-up of an insulator and contrast ascribable to configuration lower the reliability of contrast derived from the discharge of secondary electrons which is dependent on the dopant concentration In light of this, a method using chemical etching has also been proposed. This method etches a semiconductor with an etchant of the kind etching a semiconductor by an amount dependent on the dopant concentration, and then measures the etched configuration so as to match it to dopant concentrations.

The etched configuration of the semiconductor may be measured by a transmission electron microscope (TEM), as taught by Spinella et al in Proc. 3rd Intern. Workshop on the Measurements and Characterization of Ultra-Shallow Doping Profiles in Semiconductors, pp. 42.1–42.8 by way of example. However, the problem with the TEM scheme is that a substantial period of time is necessary for sample preparation.

To solve the above problem, the etched configuration may be measured by a scanning probe microscope (SPM), as also proposed in the past. Among various SPMs, a scanning tunnel microscope disclosed in Japanese Patent Laid-Open Publication No. 4-111337 was used first. However, because this type of microscope measures a tunnel current to flow between a probe and the sample surface, it cannot measure insulators. Moreover, the scanning tunnel microscope causes the removal of a native oxide layer or protection layer and other surface treatment to effect the quality of data. In light of this, there has been proposed to replace the scanning tunnel microscope with an atomic force microscope (AFM) capable of measuring an attraction or a repulsion force between its probe and the sample surface. Today, the chemical etching followed AFM scheme is predominant over the others as to the measurement of a dopant concentration distribution of a semiconductor device usually including a patterned oxide film or similar insulation film. Raineri et al, for example, teach in Appl. Phys. Lett., Vol. 64, pp. 354–356, January, 1994 a method which etches a p-type diffusion region with a hydrofluoric acid, nitric acid and acetic acid mixture with a ratio of 1:3:8 under ultraviolet irradiation, and then measure the etched configuration which depends on dopant concentration by AFM, However, when the amount of etching increases, the concentration distribution does not match in the portion adjoining the surface.

Among various technologies available for fabricating a source/drain region, ion implantation which drives ions containing a dopant into a semiconductor by accelerating them is extensively used because of its desirable controllability and reproducibility. The concentration of a dopant driven by ion implantation has a peak in the vicinity of the surface of a semiconductor. On the other hand, a hydrofluoric acid and nitric acid mixture often used as an etchant for silicon is dependent on the dopant concentration such that the amount of etching sharply increases in a high concentration region. As a result, a two-dimensional dopant concentration distribution cannot be reliably measured in such a region.

Technologies relating to the present invention are also disclosed in, e.g., Japanese Patent Laid-Open Publication No. 8-285519, IEEE ELECTRON DEVICE LETTERS, VOL. 16, NO. 3, MARCH 1995 by Barrette et al, and Nuclear Instruments and Methods in Physics Research B96 (1995), pp. 123–132 by Vandervorst et al.

SUMMARY OF THE INVENTION

It is therefore an object of the present invention to provide a method capable of measuring the two-dimensional concentration profile of a dopant even in a high concentration region.

In accordance with the present invention, a method of measuring a concentration profile has the steps of etching a desired portion of a semiconductor by use of an etchant of the kind etching a semiconductor by an amount dependent on a dopant concentration, filling tho etched configuration of the semiconductor with a filler, and measuring the configuration of the filler to thereby measure a dopant concentration profile of the semiconductor.

Also, in accordance with the present invention, a method of measuring a concentration profile has the steps of etching a desired portion of a semiconductor by use of an etchant of the kind etching a semiconductor by an amount dependent on a dopant concentration, and then measuring the etched configuration of the semiconductor to thereby measure a dopant concentration profile of the semiconductor, filling the etched configuration of the semiconductor with a filler, and measuring the configuration of the filler to thereby measure a dopant concentration profile, and measuring, if the etched configuration of the semiconductor has a recess, the configuration of the filler to thereby measure a concentration profile of the filler.

BRIEF DESCRIPTION OF THE DRAWINGS

The above and other objects, features and advantages of the present invention will become apparent from the following detailed description taken with the accompanying drawings in which:

FIG. 9 is a flowchart demonstrating a second embodiment of the present invention.

DESCRIPTION OF THE PREFERRED EMBODIMENTS

To better understand the present invention, brief reference will be made to conventional technologies for measuring a dopant concentration profile. For reliable semiconductor device design, it is necessary to measure the two-dimensional dopant concentration profile in a diffusion layer. To measure a two-dimensional dopant concentration profile with a high resolution, a method using chemical etching has been proposed, as stated earlier. The method consists in effecting etching with an etchant of the kind etching a semiconductor by an amount dependent on the concentration of a dopant, and then determining a dopant concentration distribution in terms of the resulting configuration measured. While the etched configuration may be measured by a method using a TEM, as also stated earlier, such measurement is not practicable without resorting a substantial period of time for the preparation of a sample. In light of this, the TEM may be replaced with an SPM, as follows.

Figure 1:
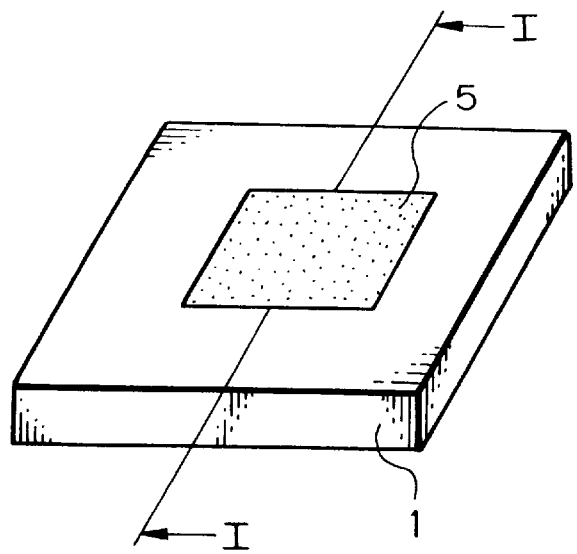
FIG. 1 is a perspective view of a sample to be measured by a conventional technology.

As shown in FIG. 1, a silicon or similar semiconductor substrate 1 is formed with a dopant inlet portion 5 by, e.g., ion implantation. The substrate or object to be measured 1 has its entire surface, including the dopant inlet portion 5, covered with a resist film or similar protection film. The substrate 1 with the protection film is cut along line I—I of FIG. 1 across the dopant inlet portion 5 on the surface of the substrate 1; the cut surface turn out a cleaved surface. After the cut piece of the substrate 1 has been cleaned, it is etched for 1 minute by an etchant of the kind etching a semiconductor by an amount dependent on the dopant concentration, e.g., a hydrofluoric acid, nitric acid and water mixture with a ratio of 1:100:25. The etcher is held at a temperature of 30±0.5° C. Consequently, the semiconductor is etched at each point of the cleaved surface by a particular amount corresponding to a dopant concentration. Thereafter, the protection layer is removed in order to expose the etched surface representative of the etched condition of the dopant inlet portion 5. Finally, the etched configuration is measured by an SPM.

Figure 2:
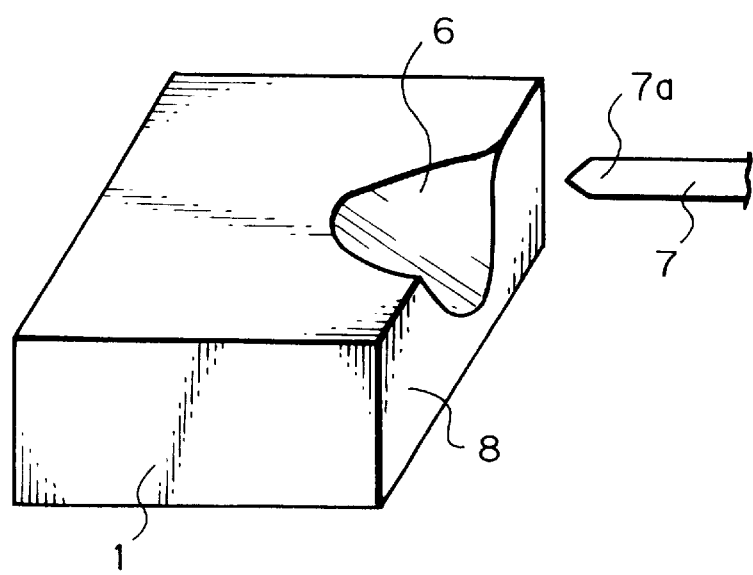
FIG. 2 is a perspective view showing a conventional method of measuring an etched configuration.

A scanning tunnel microscope was used first as an SPM, as also stated previously. As shown in FIG. 2, a voltage is applied between the etched semiconductor substrate 1 including the dopant inlet portion 6 and a probe 7a included in scanning tunnel microscope 7, causing a so-called tunnel current to flow between them. While the tunnel current is maintained constant, the probe 7a scans the cleaved surface 8 of the substrate 1. However, this type of microscope 7 measuring a tunnel current has a problem that it cannot measure insulators, and a problem that the quality of data is effected by the removal of the protection layer and other surface treatment To solve these problems, a AFM capable of measuring an attraction or a repulsion force between its probe and the sample surface has been proposed.

Figure 3:
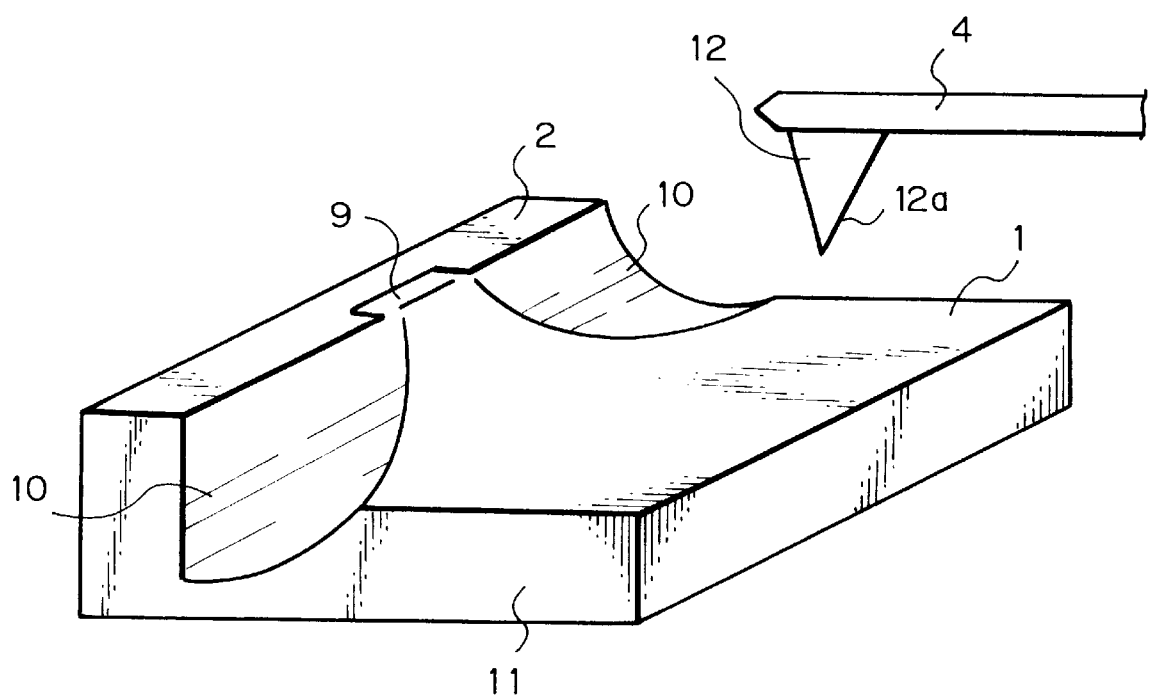
FIG. 3 is a sectional perspective view showing another conventional etched configuration.

A conventional measuring method using an AFM will be described with reference to FIG. 3. As shown, a diffusion layer 10 is formed in the semiconductor substrate 1 by the ion implantation of a dopant with a gate 9 serving as a mask. The section of the diffusion layer region is etched for 3 seconds by an etchant containing hydrofluoric acid, nitric and acetic acid in a ratio of 1:3:8, under UV irradiation. Because the amount of etching of the substrate 1 is dependent on the dopant concentration, the diffusion layer 10 is etched by a amount corresponding to a dopant concentration, as illustrated. An AFM 4 measures the configuration of the etched diffusion layer 10 with the tip 12a of its probe 12. On the other hand, data showing amounts of etching and dopant concentrations in one-to-one correspondence are prepared beforehand. Dopant concentrations are determined in terms of the amounts of etching measured by the AFM 4 by calculation based on the above data. By such a procedure, a two-dimensional concentration profile is obtained. The lower limit of the concentration profile detected is about $10^{18}$ $cm^{-3}$ which is the concentration of boron. In FIG, 3, the reference numerals 2 and 11 respectively denote an interlayer film and the side of the substrate 1.

The problem with the AFM scheme is that when the amount of etching increases, the concentration distribution does not match in the portion adjoining the surface, as discussed earlier. This is because the etched semiconductor is sharply hollowed out.

Figure 4:
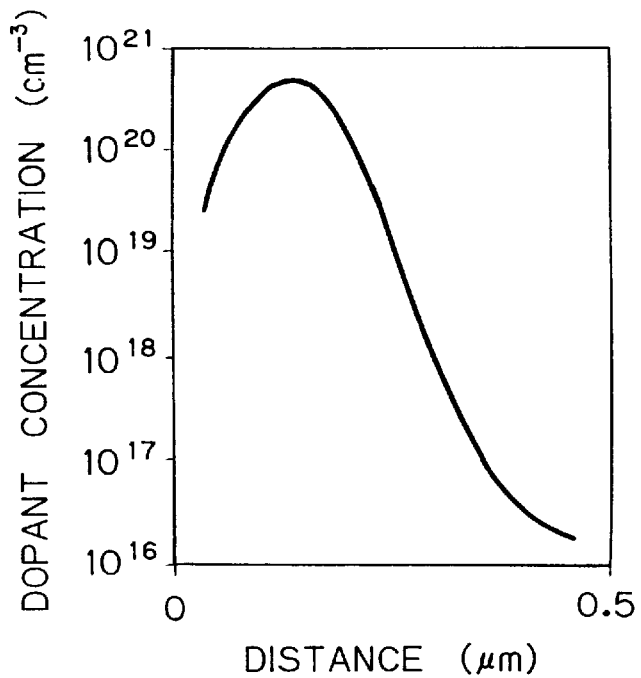
FIG. 4 is a graph showing a dopant concentration distribution in the direction of depth.
Figure 5:
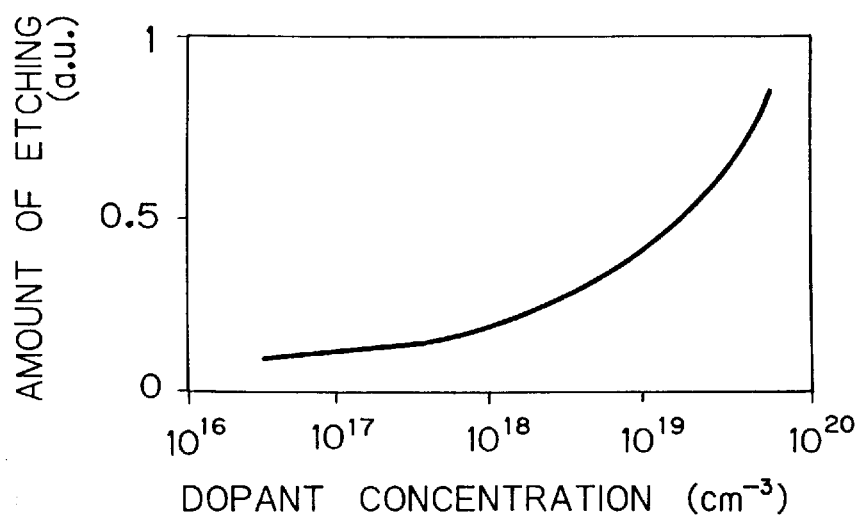
FIG. 5 is a graph showing the dependency of the amount of etching of a semiconductor on dopant concentration.

As shown in FIG. 4, a dopant introduced into the substrate by ion implantation, i.e., by driving ions containing a dopant by acceleration has a concentration distribution having a peak in the vicinity of the surface. On the other hand, a hydrofluoric acid and nitric acid mixture often used as an etcher for silicon sharply increases the amount of etching in a high concentration region, as shown in FIG. 5.

Figure 6:
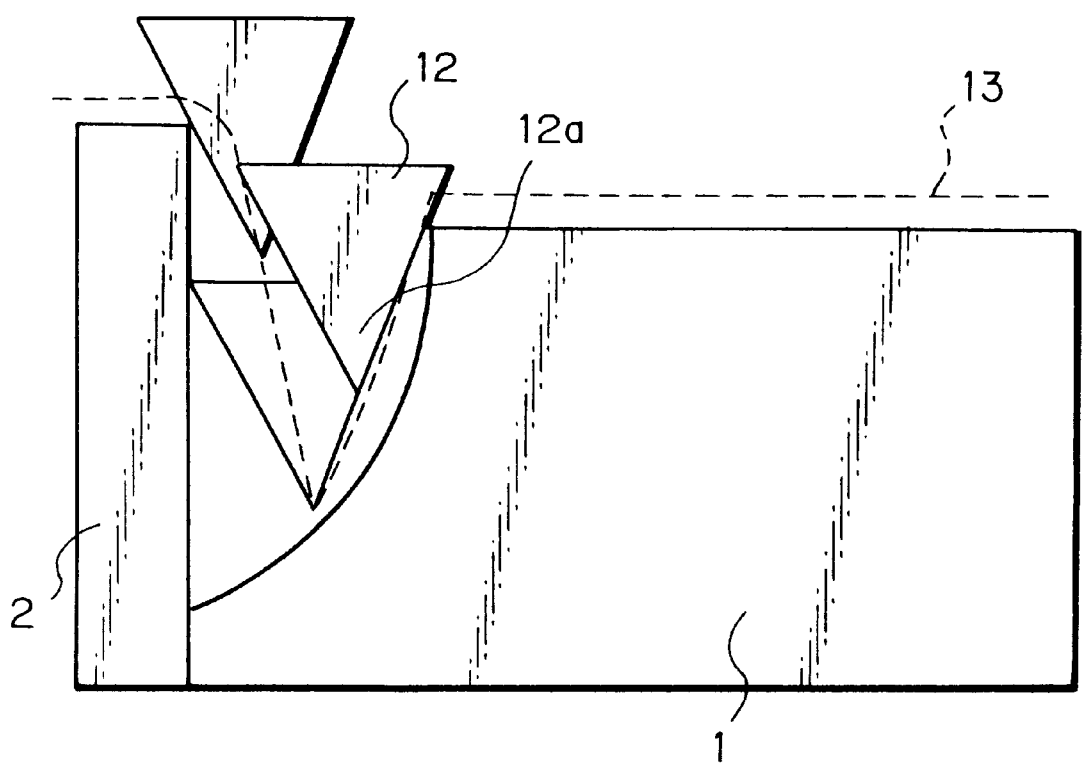
FIG. 6 is a side elevation showing a problem with the conventional technology.

Referring again to FIG. 3, the diffusion layer 10 is etched by amounts corresponding to dopant concentrations. However, because the dopant concentration is maximum in the vicinity of the surface, the amount of etching is also maximum in the vicinity of the surface. Specifically, as shown in FIG. 6 which is a section as seen from the side 11 of FIG. 3, the substrate 1 is sharply hollowed out from the top of the interlayer film or wail 2 which is not etched. In this condition, the probe 12a of the AFM 4 cannot reach the bottom of the etched bore when tracing the surface configuration. Consequently, as shown in FIG. 6, the locus of measurement 13 is different from the actual configuration in the sharply hollowed portion adjoining the interlayer film 2. This prevents an accurate profile from being achieved in the region where the dopant concentration is high.

Preferred Embodiments of the measuring method in accordance with the present invention will be described hereinafter.

1st Embodiment

This embodiment is identical with the conventional procedure as to the sequence of steps of preparing of a sample, etching the sample, and removing the protection layer from the sample. For example, a sample is prepared by forming a dopant inlet portion in a part of the surface of a silicon or similar semiconductor substrate. The substrate with the dopant inlet portion is cut across the dopant inlet portion. Of course, the substrate may be implemented by a gallium and arcenite compound or similar compound. To introduce a dopant into the substrate, while use may be made of gaseous phase diffusion or solid phase diffusion, ion implantation is more desirable because it is capable of forming a shallow and accurate p-n junction.

To provide the substrate with the cut surface, cleavage may be replaced with the steps of cutting the substrate with a rotary saw or similar cutting machine and effecting one or more of mechanical or chemical polishing and ion milling, surface damage layer etching or similar conventional mirror finishing or surface cleaning.

The cut surface of the sample is cleaned and then etched for 5 seconds by the conventional method using an etchant of the kind etching the sample in accordance with the dopant concentration. For example, use is made of a hydrofluoric acid, nitric acid and acetic acid mixture with a ratio of 4:40:10 and held at a temperature of 20±0.5° C. As a result, the semiconductor is etched at each point thereof by a particular amount corresponding to a dopant concentration under a condition wherein the dependency of the amount of etching on the dopant concentration is noticeable.

The etchant may be implemented by a hydrofluoric acid, nitric acid and water mixture, if desired. Of course, any other etchant not containing hydrofluoric acid or nitric acid may be used so long as it can etch the semiconductor by an amount dependent on the dopant concentration. The illustrative embodiment uses the hydrofluoric acid, nitric acid and acetic acid mixture or similar etchant dependent on the concentrations of only the activated part of a dopant, i.e., a carrier concentration. Alternatively, an etchant dependent on the concentrations of the entire dopant, whether it be activated or not, may be used, depending on the application. Furthermore, etching may be effected by anodic oxidation which applies a voltage during etching; white light, laser light or similar light may or may not be emitted during etching.

Subsequently, the protection Layer is removed from the surface of the substrate in order to expose the etched surface representative of the etched condition of the dopant inlet portion.

Figure 7A:
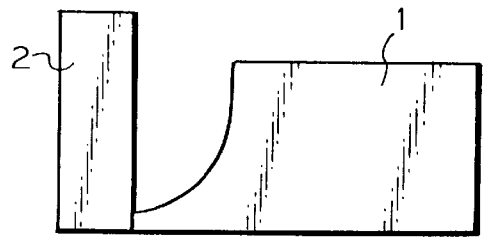
FIGS. 7A–7C are sections showing a first embodiment of the measuring method in accordance with the present invention.
Figure 7B:
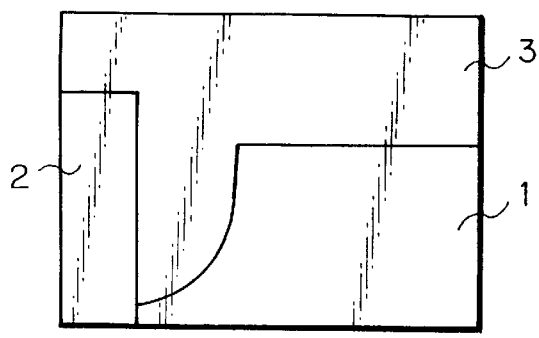
Figure 7C:
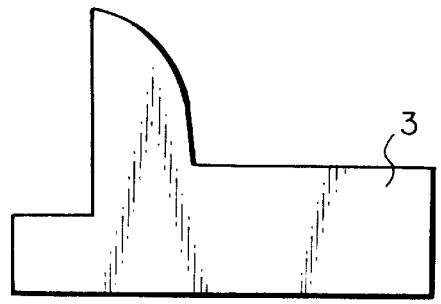

Reference will be made to FIGS. 7A–7C and 8 for describing differences between the conventional technology and the illustrative embodiment. FIG. 7A shows the etched surface of the semiconductor substrate, labeled 1, in a side elevation. As shown, the substrate 1 is noticeably etched, or hollowed out, in its portion adjoining an interlayer film 2. As shown in FIG. 7B, epoxy resin or similar filler 3 is deposited on the surface of the substrate 1 in such a manner as to fill up the etched portion or bore of the substrate 1. If desired, epoxy resin or similar synthetic resin may be replaced with beeswax, resin or similar natural resin, clay or gypsum so long as it can fill up the bore and can preserve the filled configuration in the form of a solid or a gel. Subsequently, the filler 3 is removed from the substrate 1, or the substrate 1 is removed from the filler 3 by wet etching or similar technology. As a result, as shown in FIG. 7C, the filler 3 turns out a replica of the substrate 1 whose projection and recess are complementary to those of the substrate 1 in one-to-one correspondence.

Figure 8:
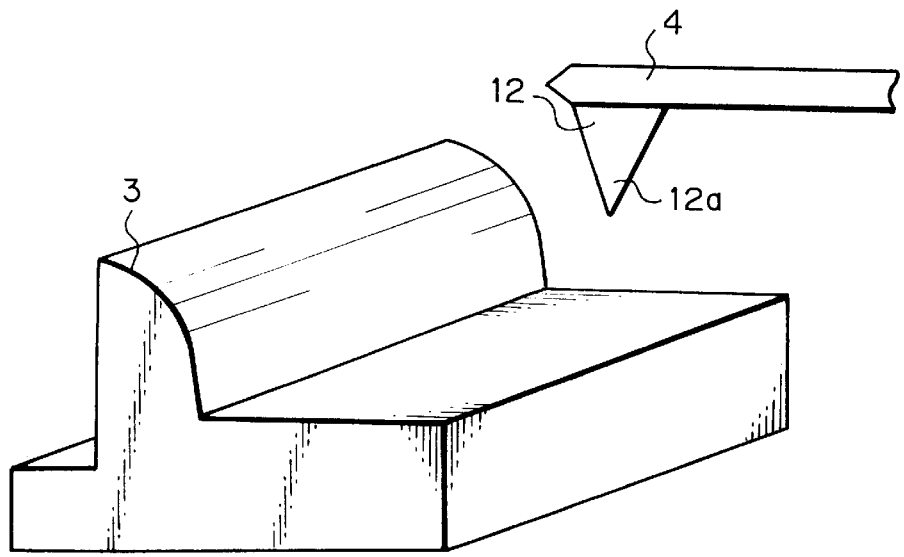
FIG. 8 is a perspective view associated with FIGS. 7A–7C.

As shown in FIG. 8, the projection of the filler 3 complementary to the bore of the substrate 1 has its surface configuration measured by the probe 12 of the AFM 4. On the other band, data showing amounts of etching and dopant concentrations in one-to-one correspondence are prepared beforehand, Dopant concentrations are produced from the amounts of etching measured by the AFM 4 by calculation based on the above data. By such a procedure, a two-dimensional dopant concentration profile is achieved with a high resolution. If the filler 3 is conductive, then the AFM 4 may be replaced with the scanning tunnel microscopy or any other suitable method of the kind tracing a configuration with a probe, e.g., a contact type step measuring device.

The projection of the filler 3 complementary to the bore of the substrate, as stated above, obviates the occurrence that a probe cannot reach the bottom of he bore. Therefore, even the portion of the substrate where the dopant concentration is high can be reliably measured. In this condition, the spatial resolution is 5 nm to 20 nm which is the radius of curvature of the tip of the probe. Such a resolution allows the two-dimensional dopant concentration profile of a source/drain region to be measured even at the submicrons junction depth of a semiconductor device.

While the above embodiment has concentrated on boron, boron is a specific dopant and may be replaced with phosphor, arsenic or similar dopant customarily introduced into semiconductors.

2nd Embodiment

Referring to FIGS. 9 and 10A–10C, a procedure representative of an alternative embodiment of the present invention will be described. First, a protection layer is formed on the semiconductor substrate 1 (step S1). For example, a protection film is formed an a sample prepared by forming a dopant inlet portion on a part of a silicon or similar semiconductor substrate, as in the first embodiment. Then, the substrate 1 is cut and has its cut surface cleaned (step S2). Specifically, the substrate 1 is cleaved or is cut by a cutting machine and then polished and/or cleaned, as in the previous embodiment. Thereafter the cut surface is cleaned by the conventional method.

Subsequently, the substrate 1 is etched by an etchant of the kind etching a semiconductor by an amount dependent on the dopant concentration, as in the previous embodiment (step S3). For example, the substrate 1 is etched by a hydrofluoric acid, nitric acid and acetic acid mixture with a ratio of 2:40:10' for 10 seconds at 5° C. As a result, the semiconductor is etched at each point by a particular amount corresponding to a dopant concentration. Subsequently, the protection layer is removed from the surface of the substrate in order to expose the etched surface representative of the etched condition of the dopant inlet portion (step S4; see FIG. 10A).

After the removal of the protection layer, the etched surface of the dopant inlet portion of the substrate 1 is measured by, e.g., an AFM, as in the first embodiment (step S5). Then, the epoxy resin or similar filler 3 is deposited on the surface of the substrate 1 in such a manner as to fill up the etched portion or bore of the substrate 1, as in the first embodiment (step S6; see FIG. 10B).

Subsequently, the filler 3 is removed from the substrate 1, or the substrate 1 is removed from the filler 3 by wet etching or similar technology (step S7). As a result, the filler 3 turns out a replica of the substrate 1 whose projection and recess are complementary to those of the substrate 1 in one-to-one correspondence (see FIG. 10C). The projection of the filler 3 complementary to the bore of the substrate 1 has its surface configuration measured by the probe 12 of the AFM, as in the previous embodiment.

After the measurement of the projection of the filler 3, whether or not the filler 3 has any recess is determined (step S9). If the filler 3 has no recesses (NO, step S9), then dopant concentrations are calculated on the basis of the data stated earlier in relation to the previous embodiment (step 510).

Figure 10A:
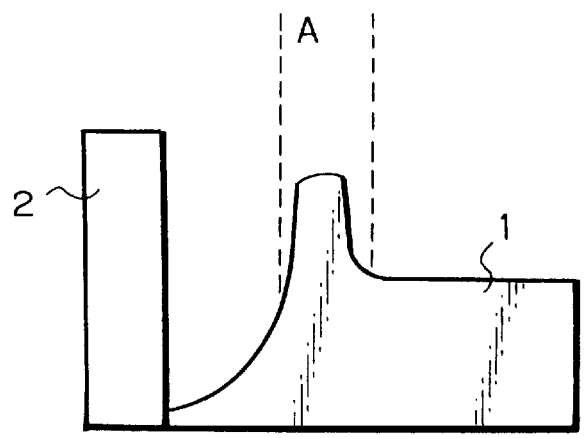
FIGS. 10A–10C are sections associated with FIG. 9.
Figure 10B:
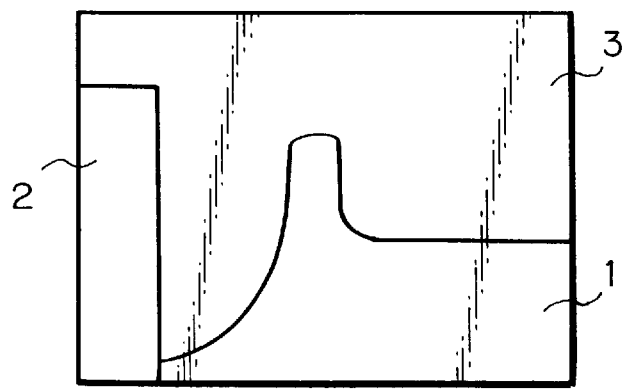
Figure 10C:
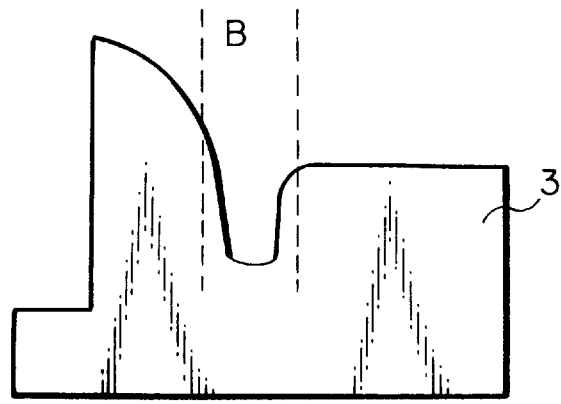

A sequence of steps to be executed when the filler 3 has a recess or recesses (YES, step S9) is as follows. As shown in FIG. 10C specifically, assume that a recess B exists in the filler 3. Then, as shown in FIG. 10A, the original substrate 1 should have a projection A complementary to the recess B because the filler 3 is a faithful replica of the etched substrate 1. First, data representative of the entire configuration of the filler 3 except for the recess portion B are separated (step S11). As for the recess portion B, data representative of the etched configuration having been measured are separated (step S12). Specifically, because the filler 3 is a replica of the etched substrate 1, the etched region includes the recess A. Dopant concentrations are calculated on the basis of the previously stated data and the shape of the filler 3 except for the portion B and the etched shape of the portion A of the substrate 1, as in the first embodiment (step S13).

As stated above, the second embodiment, like the first embodiment, is capable of measuring a two-dimensional dopant concentration profile reliably with a high resolution. In addition, the second embodiment achieves a sufficiently low lower limit of measurement. Further, the second embodiment, like the first embodiment, is practicable without regard to the kind of a semiconductor, etching conditions, or the kind of a dopant.

In summary, in accordance with the present invention, a measuring method is capable of measuring a concentration profile even where dopant concentration is high. Specifically, considering the fact that a measuring method of the type using, e.g., an AFM tracing a configuration with its probe is more advantageously applicable to a projection than to a recess, the method produces a replica by using a filler. It follows that a two-dimensional dopant concentration distribution can be reliably measured even in a region where the dopant concentration is high.

The method of the invention is practicable not only with an AFM or a scanning tunnel microscope, but also with any other method of the kind tracing a configuration with a probe, e.g., one using a contact type step measuring device. Further, the method of the invention is a promising method even for future applications because it allows a probe to surely enter an etched bore even when the junction depth decreases.

Various modifications will become possible for those skilled in the art after receiving the teachings of the present disclosure without departing from the scope thereof.

What is claimed is:

1. A method of measuring a concentration profile, comprising the steps of:
    etching a desired portion of a semiconductor by use of an etchant of a kind etching a semiconductor by an amount dependent on a dopant concentration;
    filling an etched configuration of said semiconductor with a filler; and
    measuring a configuration of said filler to thereby measure a dopant concentration profile of said semiconductor.

2. A method as claimed in claim 1, wherein said filler comprises one of synthetic resin, natural resin, clay, and gypsum.

3. A method as claimed in claim 1, wherein the configuration of said filler is measured by tracing said configuration with a probe.

4. A method as claimed in claim 1, further comprising the step of removing said filler from said semiconductor or removing, by etching, said semiconductor from said filler, and then measuring the configuration of said filler.

5. A method of measuring a concentration profile, comprising the steps of:
    etching a desired portion of a semiconductor by use of an etchant of a kind etching a semiconductor by an amount dependent on a dopant concentration, and then measuring an etched configuration of said semiconductor to thereby measure a dopant concentration profile of said semiconductor;
    filling the etched configuration of said semiconductor with a filler, and measuring a configuration of said filler to thereby measure a dopant concentration profile; and
    measuring, if the etched configuration of said semiconductor has a recess, the configuration of said filler to thereby measure a concentration profile of said filler.

6. A method as claimed in claim 5, wherein said filler comprises one of synthetic resin, natural resin, clay, and gypsum.

7. A method as claimed in claim 5, wherein the configuration of said filler is measured by tracing said configuration with a probe.

8. A method as claimed in claim 5, further comprising the step of removing said filler from said semiconductor or removing, by etching, said semiconductor from said filler, and then measuring the configuration of said filler.

* * * * *

UNITED STATES PATENT AND TRADEMARK OFFICE
CERTIFICATE OF CORRECTION

PATENT NO. : 6,121,060
DATED : September 19, 2000
INVENTOR(S) : Akiko Kameyama

It is certified that error appears in the above-identified patent and that said Letters Patent is hereby corrected as shown below:

Column 4, line 53, delete "wail" insert --wall--

Column 6, line 45, delete "10' " insert --10--

Column 7, line 5, delete "510" insert --S10--

Signed and Sealed this

Twenty-second Day of May, 2001

*Attest:*

NICHOLAS P. GODICI

*Attesting Officer*     Acting Director of the United States Patent and Trademark Office